(12) United States Patent
Huijsing et al.

(10) Patent No.: US 7,202,738 B1
(45) Date of Patent: Apr. 10, 2007

(54) ACCURATE VOLTAGE TO CURRENT CONVERTERS FOR RAIL-SENSING CURRENT-FEEDBACK INSTRUMENTATION AMPLIFIERS

(75) Inventors: Johan Hendrik Huijsing, Schipluiden (NL); Behzad Shahi, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 20 days.

(21) Appl. No.: 11/054,140

(22) Filed: Feb. 8, 2005

(51) Int. Cl.
*H03F 3/45* (2006.01)

(52) U.S. Cl. ...................... 330/253; 330/252
(58) Field of Classification Search ............... None
See application file for complete search history.

(56) References Cited

U.S. PATENT DOCUMENTS

| | | | |
|---|---|---|---|
| 3,007,116 A | 10/1961 | Gerhard | |
| 4,559,502 A | 12/1985 | Huijsing | |
| 4,633,223 A | 12/1986 | Senderowicz | |
| 5,486,790 A | 1/1996 | Huijsing et al. | |
| 6,456,159 B1 | 9/2002 | Brewer | |
| 6,559,720 B1 | 5/2003 | Huijsing et al. | |
| 6,611,171 B2* | 8/2003 | Kimura | 330/253 |
| 6,734,723 B2 | 5/2004 | Huijsing et al. | |
| 7,038,501 B2* | 5/2006 | Lee et al. | 327/108 |
| 7,132,883 B2 | 11/2006 | Huijsing et al. | |
| 2003/0234689 A1* | 12/2003 | Leighton et al. | 330/252 |
| 2006/0055456 A1 | 3/2006 | Niederkorn | |

OTHER PUBLICATIONS

Van Den Dool, Bernard.J., et al., "Indirect Current Feedback Instrumentation Amplifier with a Common-Mode Input Range that Includes the Negative Rail", IEEE Journal of Solid-State Circuits, Jul. 1993, pp. 743-749, vol. 28, No. 7.
Huijsing, Johan H., "Operational Amplifiers Theory and Design", Mar. 2001, p. 408, Kluwer Academic Publishers.
Linear Technology Corporation, "LTC6800 Rail-to-Rail Input and Output, Instrumentation Amplifier", 2002, pp. 1-12.

* cited by examiner

*Primary Examiner*—Robert Pascal
*Assistant Examiner*—Alan Wong
(74) *Attorney, Agent, or Firm*—Blakely, Sokoloff, Taylor & Zafman LLP

(57) ABSTRACT

Accurate voltage to current converters for rail-sensing current-feedback instrumentation amplifiers using folded cascode transistors. Embodiments using various degrees of cascoding, as well as using bootstrapped folded cascoded input transistors are disclosed. Circuits for sensing around the negative rail are disclosed, though circuits for sensing around the positive rail may be readily achieved by use of complementary devices.

7 Claims, 5 Drawing Sheets

ACCURATE VOLTAGE TO CURRENT CONVERTERS FOR RAIL-SENSING CURRENT-FEEDBACK INSTRUMENTATION AMPLIFIERS

BACKGROUND OF THE INVENTION

1. Field of the Invention

The present invention relates to the field of instrumentation amplifiers.

2. Prior Art

Instrumentation amplifiers are often used to sense small differential voltages having a common mode voltage near the negative or positive supply-rail voltages. Instrumentation amplifiers with a so-called three operational amplifier (opamp) architecture are not able to sense in a range close to the rail unless separate level shifts are used at the input. More specifically, these architectures use voltage feedback around operational amplifiers to the input, and the feedback output voltage cannot go below the negative rail or above the positive rail without a level shift. Moreover, the voltage feedback around the opamp reduces its common mode rejection ratio.

There are two major options. Firstly, the rail sensing can be obtained with switched or 'flying' capacitors [Ref. 1: LTC6800 Spec. sheet]. This has the disadvantage of a relative low bandwidth. Secondly, the rail sensing can be achieved by a continuous-time current feedback instrumentation amplifier [Ref. 2: Bernard van den Dool], [Ref. 3: U.S. Pat. No. 6,559,720]. A general block diagram for such an amplifier is shown in FIG. 1.

Instrumentation amplifiers with current feedback for sensing at the rail voltage conventionally use simple voltage-to-current (V-I) converters, as shown in FIG. 3 [Ref. 2: Berhard van den Dool]. The non-linearity of these simple V-I converters cancels when used in an instrumentation amplifier as shown in FIG. 1. The relative high offset, and poor common-mode rejection ratio (CMRR), can be largely improved by the chopper instrumentation amplifier architecture of FIG. 2. But residual inaccuracies and non-linearities of the simple differential amplifier stages of the order of 0.1% are still too much for accurate applications. Therefore, ways to improve the accuracy are desired.

Voltage feedback or voltage boosting can be applied around the P-channel input transistors to improve their accuracy, as shown in FIG. 4. Voltage feedback reduces the influence of the input transistors on the accuracy and linearity. The result is that the transconductance G of the input stages is fully determined by the source resistors $R_s$, so that G becomes equal to $G=2/(R_{S1}+R_{S2})$. These resistors can be chosen as both accurate and linear. However the ability to sense around the negative supply rail is lost again in the architecture of FIG. 4, because the output voltages of the operational amplifiers cannot be drawn below the negative supply rail voltage.

DETAILED DESCRIPTION OF THE PREFERRED EMBODIMENTS

Figure 1:
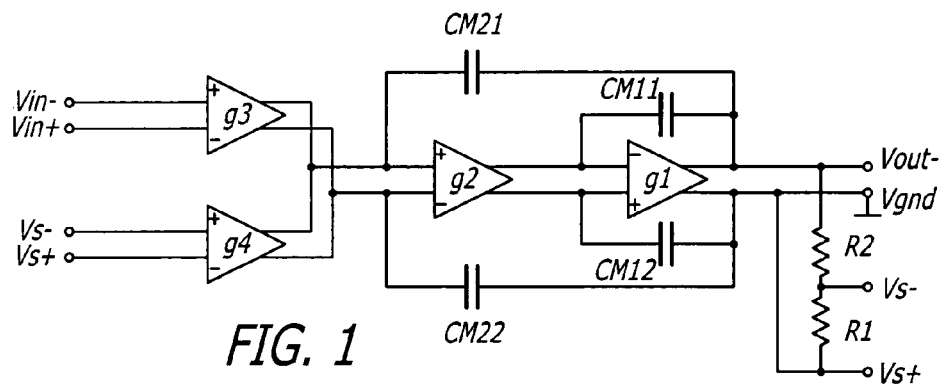
FIG. 1 is a block diagram of a prior art current feedback instrumentation amplifier using voltage to current (V-I) converters on the input and output feedback amplifiers.
Figure 2:
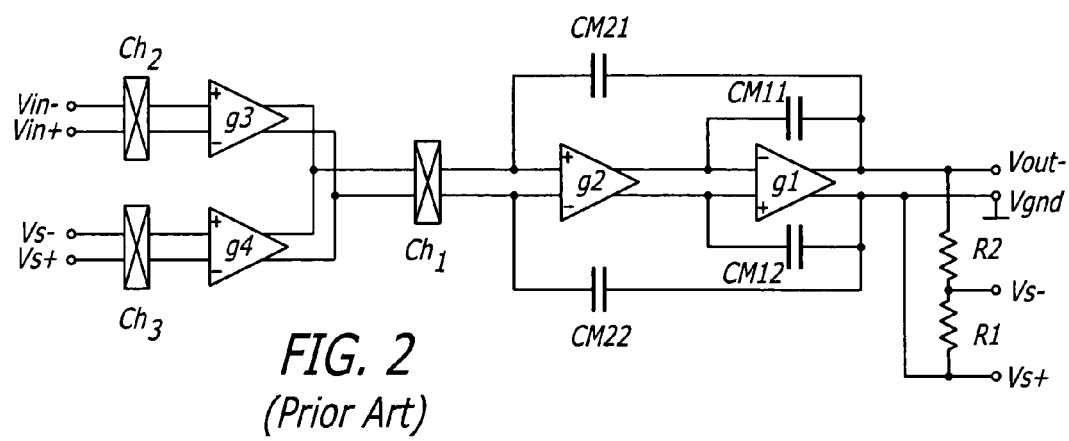
FIG. 2 is a block diagram of a prior art chopper stabilized current feedback instrumentation amplifier using voltage to current (V-I) converters on the input and current feedback amplifiers.
Figure 5:
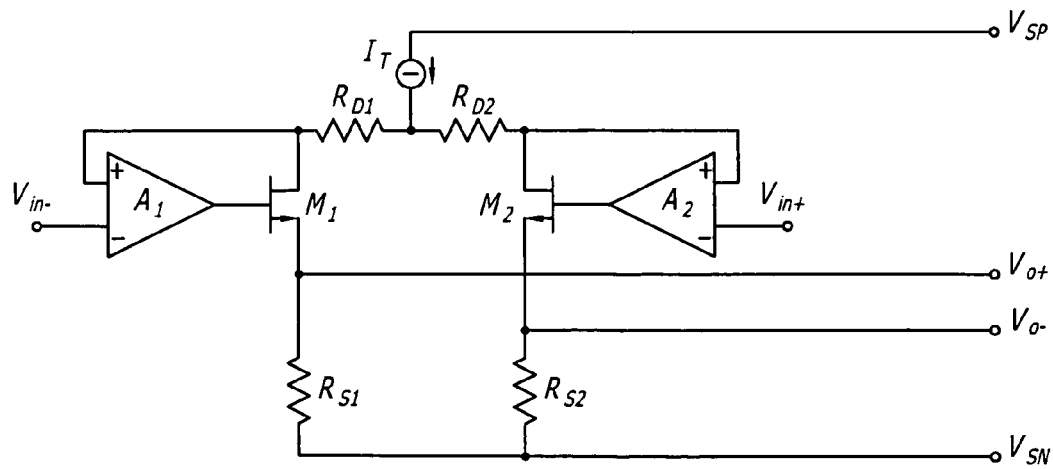
FIG. 5 is a diagram similar to that of FIG. 4, but with the polarity of the connection to the input of the operational amplifiers reversed, and with complementary N-channel output transistors.

To solve the problems stated in the introduction, one can reverse the polarity of the connection to the input of the operational amplifiers and use complementary N-channel output transistors, as depicted in FIG. 5. If the negative inputs of the operational amplifiers are able to sense around the negative rail, and if one internal transistor voltage shift upward is applied to the positive input of the operational amplifiers, then the circuit of FIG. 5 approaches the goal. But the solution of FIG. 5 has still a number of disadvantages. Firstly, the noise of the differential input pair of the operational amplifiers is added to the noise of the instrumentation amplifier. Secondly, a simple circuit is desired. Particularly, when this V-I converter is used in the chopper instrumentation amplifier of FIG. 2, many parasitic capacitors cannot be tolerated. Thirdly, the loop gain is decreased by the source degeneration resistors $R_{S1}$ and $R_{S2}$ of the output transistors $M_1$ and $M_2$. Hence, the operational amplifiers need a high voltage gain.

Figure 6:
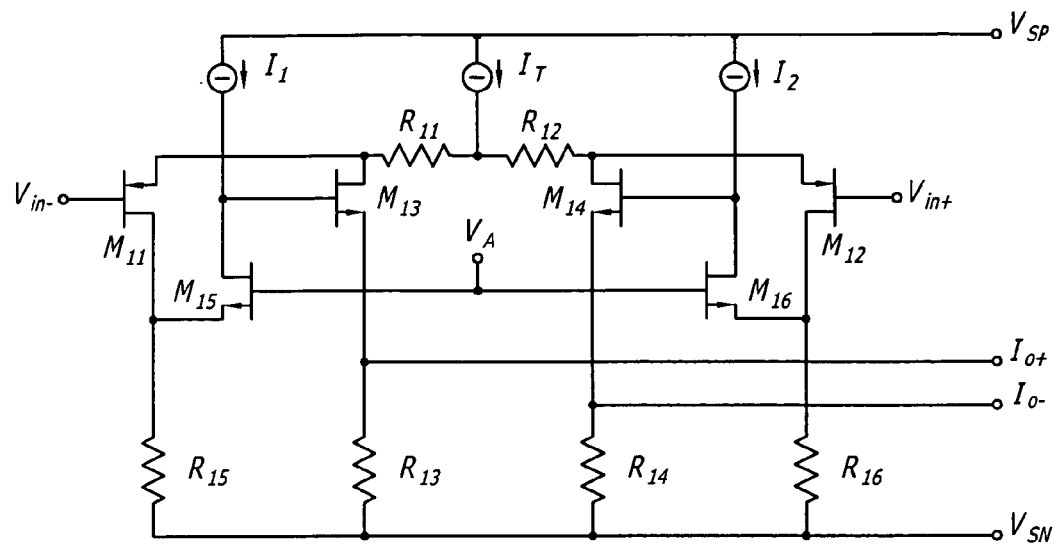
FIG. 6 is a circuit diagram for a V-I converter using folded cascode transistor pairs on the input.

The circuit of FIG. 6 shows the transistor implementation of an embodiment of the present invention. Only one sense transistor $M_{11}$ or $M_{12}$ per side is between the input and the gain and linearity setting resistor $R_{11}$ or $R_{12}$. So the noise and offset contribution is nearly equal to the simple differential pair of FIG. 3. The input sense transistors are terminated by drain resistors $R_{15}$ or $R_{16}$ acting as current sources. The folded cascode transistors $M_{15}$ and $M_{16}$ collect any excess current by which the output transistor $M_{13}$ and $M_{14}$ are driven. The circuit is simple. However the transconductance of the composite input transistor $G_{1,2}=A_{V15,16}/R_{13,14}$ is still relatively low. The voltage gain in the loop is:

$$A_{V15,16} \approx \mu_{11,12}\, \mu_{15,16}$$

$$\mu_{11,12} \approx G_{m11,12} \times R_{DS11,12} \text{ and}$$

$$\mu_{15,16} \approx G_{m15,16} \times R_{DS15,16}$$

Figure 3:
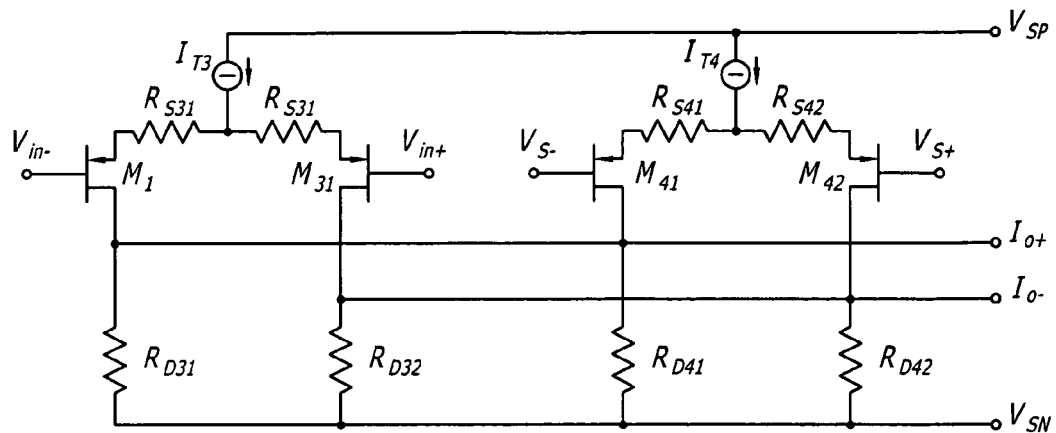
FIG. 3 is a circuit diagram for a conventional V-I converter for a current-feedback instrumentation amplifier that can sense around the negative supply rail.
Figure 4:
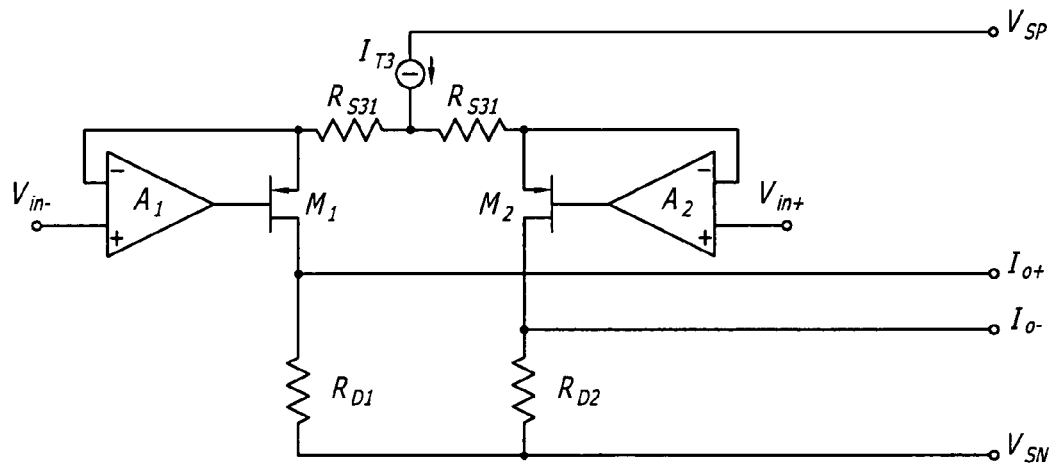
FIG. 4 is a diagram for a conventional V-I converter using voltage feedback or voltage boosting around the P-channel input transistors to improve their accuracy.

The transconductance of the input transistors has roughly been increased by the maximum voltage gain $\mu_{15,16} \approx 30$ in regard to the conventional circuit of FIG. 3. The circuit basically satisfies the specification, though it would be desirable to further improve the loop gain.

Figure 7:
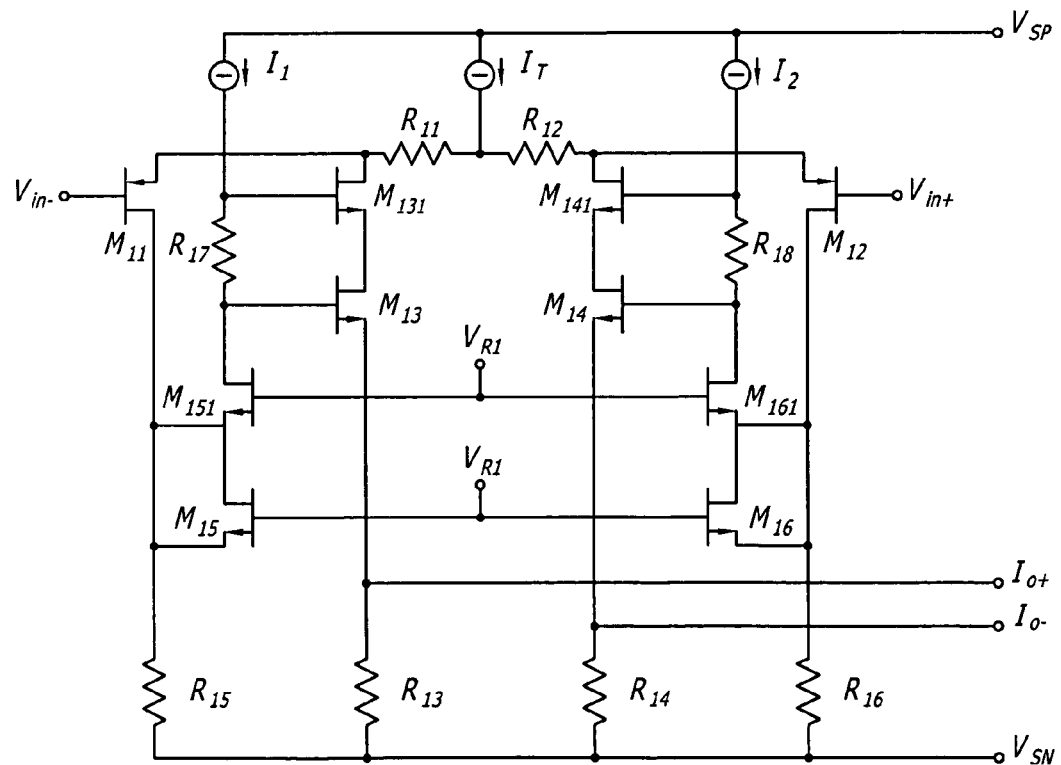
FIG. 7 is a circuit diagram for a V-I converter similar to that of FIG. 6, further cascading the cascode transistors of FIG. 6.

In order to further increase the loop gain, the folded cascode transistors $M_{15}$ and $M_{16}$ can be cascoded by transistors $M_{15_1}$ and $M_{161}$, as depicted in FIG. 7. Now the transconductance of the composite input transistors is increased by a factor $\mu_{15,16} \times \mu_{151,161} \approx 1000$ in comparison to the conventional circuit of FIG. 3. Finally, to decrease the influence of a common-mode voltage on the output current, the output transistors $M_{13}$ and $M_{14}$ have also been cascoded by transistors $M_{13_1}$ and $M_{141}$. The result is an accurate and linear overall transconductance $G=2/(R_{11}+R_{12})$.

The resulting offset and CMRR are still comparable with those of a single pair as shown in FIG. 3. A large decrease of the offset and increase of the CMRR can be obtained if the accurate composite V-I converter is used for the V-I converters $G_3$ and $G_4$, together with choppers, in the amplifier of FIG. 2.

Figure 8:
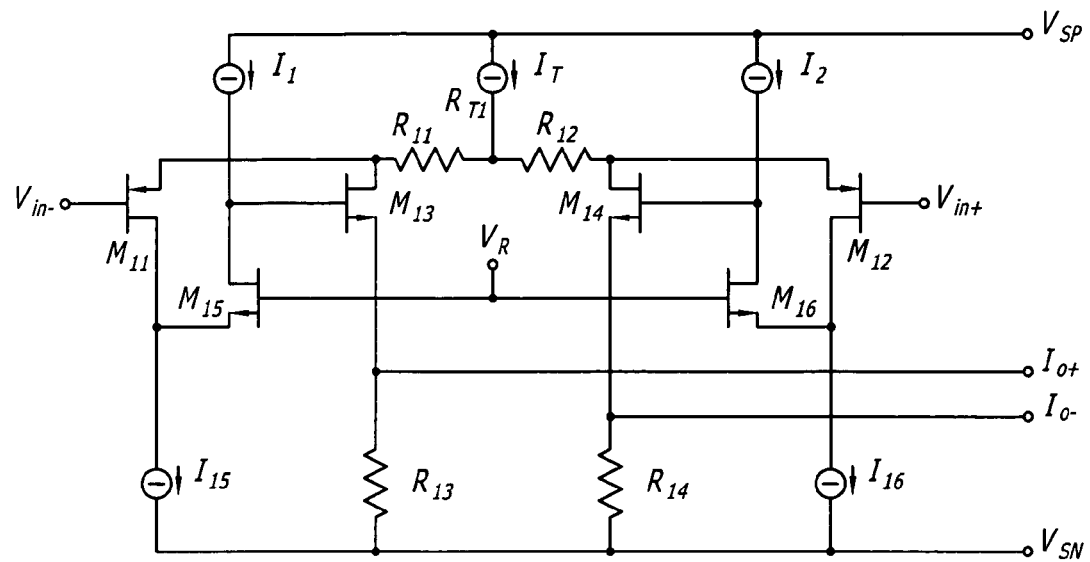
FIG. 8 is a circuit diagram for a V-I converter similar to that of FIG. 6, but using active current sources on the input transistors.

Alternatively to the straight-cascoding of transistors, one can also improve the folded-cascode function of $M_{15}$ and $M_{16}$ in FIG. 6 by replacing the source resistors $R_{15}$ and $R_{16}$ by active current sources I15 and I16, respectively. This is shown in FIG. 8. The gains of the folded cascodes $M_{15}$ and $M_{16}$ will be increased by these current sources so that no cascoding of $M_{15}$ and $M_{16}$ is needed. To minimize the voltage drop across $I_{15}$ and $I_{16}$, one can gain-boost the transistors $M_{15}$ and $M_{16}$ by controlling their gate voltages by the output of simple differential amplifiers, so that their source voltages remain equal to a reference voltage. This voltage-boost is shown in FIG. 11.

To further improve the CMRR of the V-I converter of FIG. 7, it is desirable to cascode the input transistors to reduce the influence of a change of their drain-source voltages. This can be done by cascode transistors $M_{111}$ and $M_{121}$ in series with $M_{11}$ and $M_{12}$, respectively, as shown in FIG. 7. To insure that transistors $M_{11}$ and $M_{12}$ are not biased in the triode region, the threshold voltages $V_T$ of transistors $M_{11}$ and $M_{12}$ will be at least 0.2 volts higher than those of transistors $M_{111}$ and $M_{121}$. These cascodes can also be applied in FIG. 8.

Figure 9:
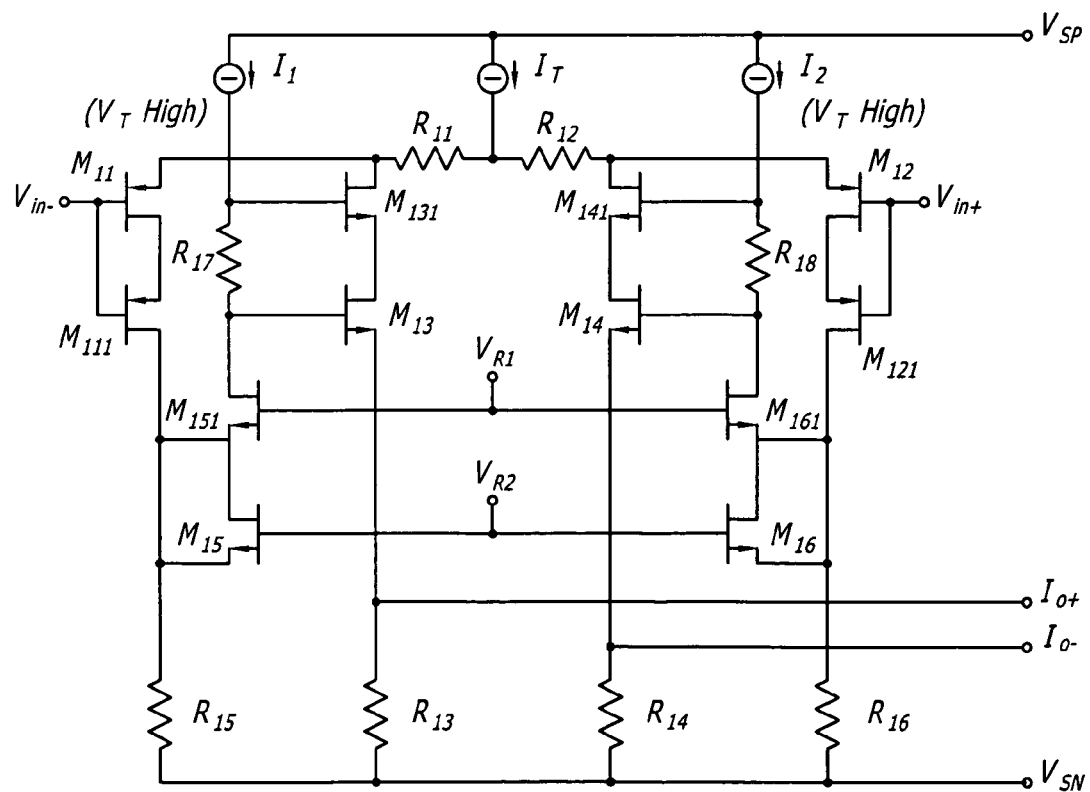
FIG. 9 is a circuit diagram for a V-I converter similar to that of FIG. 7, but further cascading the input transistors of FIG. 7.
Figure 10:
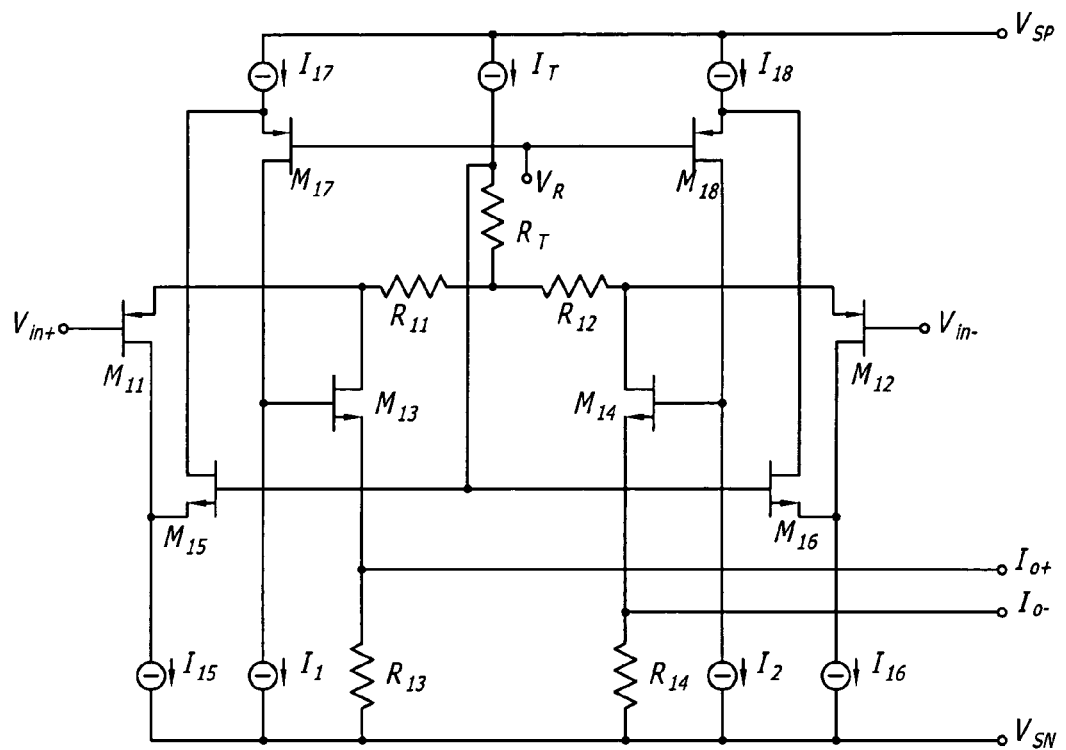
FIG. 10 is a circuit diagram for a V-I converter with bootstrapping of the folded cascode transistors $M_{15}$ and $M_{16}$ toward the common-source point of transistors $M_{11}$ and $M_{12}$, instead of applying straight cascode transistors $M_{111}$ and $M_{121}$ as in FIG. 9.

Improvement of the CMRR of the V-I converter can also be obtained by bootstrapping the folded cascodes $M_{15}$ and $M_{16}$ toward the common-source point of $M_{11}$ and $M_{12}$, instead of applying straight cascode transistors $M_{111}$ and $M_{12}$, as in FIG. 9. This is shown in FIG. 10. The gates of transistors $M_{15}$ and $M_{16}$ are now connected to the upper side of resistor $R_T$, connected in series with the current source for resistors $R_{11}$ and $R_{12}$. This takes the gates of transistors $M_{15}$ and $M_{16}$ to a slightly higher voltage in regard to the source voltages of transistors $M_{11}$ and $M_{12}$. This higher voltage is needed to provide room for allowing the inputs to sense below the negative power supply rail. Another folded cascode pair, transistors $M_{17}$ and $M_{18}$, is now needed to allow an independent input common mode range in regard to the output voltage range.

Figure 11:
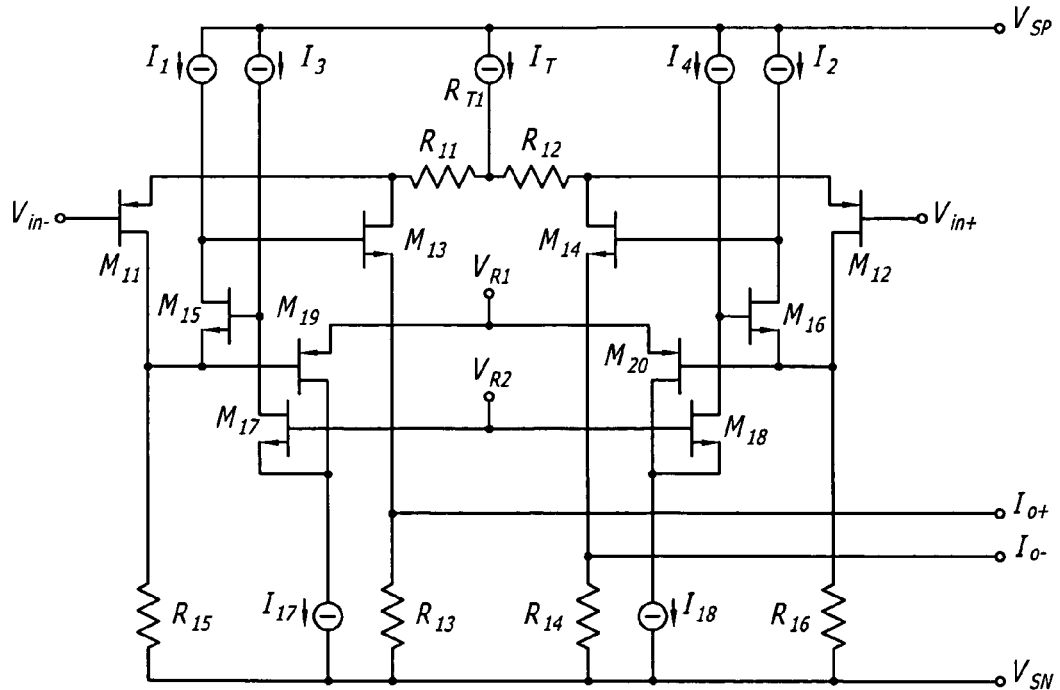
FIG. 11 is a circuit diagram for a V-I converter in accordance with the present invention with gain boost in the folded cascodes.

Now referring to FIG. 11, a V-I converter in accordance with the present invention with gain boost in the folded cascodes may be seen. In this embodiment, components with the same identifications as in FIG. 6 perform substantially the same functions. Here however, current sources I3, I4, I17 and I18 and transistors $M_{17}$ thorough $M_{20}$ have been added. Transistors $M_{19}$ and $M_{20}$ sense the voltages across the resistors $R_{15}$ and $R_{16}$. These resistors carry the currents of the input transistors $M_{11}$ and $M_{12}$. If any change of these currents or voltages occurs, the folded cascode transistors $M_{15}$ and $M_{16}$ receive correction signals on their gates by the gain boost amplifier transistors $M_{19}$, $M_{17}$ and $M_{20}$, $M_{18}$. These correction signals regulate transistors $M_{15}$ and $M_{16}$ such that their source voltages remain constant, and so the currents through resistors $R_{15}$ and $R_{16}$, and so the currents of the input transistors $M_{11}$ and $M_{12}$, and so the gate source voltages of the input transistors. This means that the transconductance of the V-I converter is more accurately determined by resistors $R_{11}$ and $R_{12}$ alone.

Thus there are disclosed embodiments of accurate and linear V-I converters with composite input transistors for use in current-feedback instrumentation amplifiers. The V-I converters are able to sense differential input voltages in a range around the negative supply rail, though complementary circuits can be used for sensing around the positive supply rail. The V-I converter combines simplicity and accuracy with a minimum offset.

While CMOS circuits have been disclosed, one can realize the present invention using bipolar transistors or combinations of bipolar and CMOS transistors. Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A differential voltage to current converter comprising:
   first and second transistors of a first conductivity type and third through sixth transistors of a second conductivity type, each transistor having first and second terminals and a control terminal, the conduction between the first and second terminal being controlled by the voltage between the control terminal and the first terminal;
   first through fifth current sources;
   first through fourth resistors each having first and second terminals;
   the second current source being coupled between a first power supply terminal and the first terminals of the first and second resistors, the second terminals of the first and second resistors being coupled to the first terminals of the first and second transistors, respectively, the second terminals of the first and second transistors being coupled to a second power supply terminal through fourth and fifth current sources, respectively, and to the first terminals of the fifth and sixth transistors, respectively;
   the first and third current sources being coupled between the first power supply terminal and the control terminals of the third and fourth transistors, respectively, and to the second terminals of the fifth and sixth transistors, respectively;
   the third and fourth transistors having their second terminals coupled to the second terminals of the first and second resistors, respectively, and their first terminals coupled through the third and fourth resistors to the second power supply terminals, respectively, the first terminals of the third and fourth transistors also being coupled to first and second output terminals of the differential voltage to current converter;

the control terminals of the fifth and sixth transistors being coupled to a first reference voltage;

the control terminals of the first and second transistors being coupled to first and second input terminals, respectively, of the differential voltage to current converter.

2. The differential voltage to current converter of claim 1 wherein the fourth and fifth current sources are resistors.

3. The differential voltage to current converter of claim 1 further comprising:

seventh through tenth transistors of the second conductivity type, each transistor having first and second terminals and a control terminal, the conduction between the first and second terminal being controlled by the voltage between the control terminal and the first terminal;

fifth and sixth resistors;

the first and third current sources being coupled between the first power supply terminal and the second terminals of the fifth and sixth transistors, respectively, through the fifth resistor and the seventh transistor, and the sixth resistor and the eighth transistor, respectively, the first terminals of the seventh and eighth transistors being coupled to the second terminals of the fifth and sixth transistors, respectively, the second terminals of the seventh and eighth transistors being coupled to the fifth and sixth resistors, respectively, the control terminals of the seventh and eighth transistors being coupled to a second reference voltage;

the third and fourth transistors having their second terminals coupled to the second terminals of the first and second resistors, respectively, through the ninth and tenth transistors, respectively, the second terminals of the ninth and tenth transistors being coupled to the second terminals of the first and second resistors, respectively, the first terminals of the ninth and tenth transistors also being coupled to the second terminals of the third and fourth transistors, respectively, the control terminals of the ninth and tenth transistors being coupled to the first and third current sources.

4. The differential voltage to current converter of claim 3 further comprising;

eleventh and twelfth transistors of a first conductivity type, each transistor having first and second terminals and a control terminal, the conduction between the first and second terminal being controlled by the voltage between the control terminal and the first terminal;

the second terminals of the first and second transistors being coupled to the fourth and fifth current sources, respectively, and to the first terminals of the fifth and sixth transistors, respectively, through the eleventh and twelfth transistors, respectively, the second terminals of the first and second transistors being coupled to the first terminals of the eleventh and twelfth transistors, the second terminals of the eleventh and twelfth transistors being coupled to the fourth and fifth current sources, respectively, and to the first terminals of the fifth and sixth transistors, respectively, the control terminals of the eleventh and twelfth transistors being coupled to the control terminals of the first and second transistors, respectively.

5. The differential voltage to current converter of claim 4 wherein the first and second transistors have a higher threshold than the eleventh and twelfth transistors.

6. The differential voltage to current converter of claim 1 wherein the fourth and fifth current sources are active current sources.

7. The differential voltage to current converter of claim 1 further comprising:

seventh and eighth transistors of the first conductivity type, each having first and second terminals and a control terminal, the conduction between the first and second terminal being controlled by the voltage between the control terminal and the first terminal;

sixth and seventh current sources and a fifth resistor;

the first and third current sources being coupled between the first power supply terminal and the control terminals of the third and fourth transistors through the seventh and eighth transistors, respectively;

the second current source being coupled between the first power supply terminal and the first terminals of the first and second resistors through the fifth resistor;

the control terminals of the seventh and eighth transistors being coupled to a second reference voltage;

the control terminals of the third and fourth transistors being coupled to the second power supply terminal through the sixth and seventh current sources, respectively;

the first reference voltage being the voltage of the connection between the second current source and the fifth resistor.

* * * * *